(12) United States Patent
Hayakawa

(10) Patent No.: US 6,723,608 B2
(45) Date of Patent: Apr. 20, 2004

(54) METHOD FOR MANUFACTURING A SEMICONDUCTOR DEVICE HAVING A LAYERED GATE ELECTRODE

(75) Inventor: Tsutomu Hayakawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/406,311

(22) Filed: Apr. 4, 2003

(65) Prior Publication Data

US 2003/0190798 A1 Oct. 9, 2003

(30) Foreign Application Priority Data

Apr. 5, 2002 (JP) .......................... 2002-104128

(51) Int. Cl.$^7$ ................. H01L 21/336; H01L 21/3205; H01L 21/4763

(52) U.S. Cl. ................. 438/299; 438/585; 438/592; 438/595

(58) Field of Search ................. 438/299, 303, 438/305, 585, 592, 591, 595

(56) References Cited

U.S. PATENT DOCUMENTS

| | | | | |
|---|---|---|---|---|
| 5,162,884 A | * | 11/1992 | Liou et al. ............. | 257/384 |
| 5,304,504 A | * | 4/1994 | Wei et al. ............. | 438/303 |
| 5,856,227 A | * | 1/1999 | Yu et al. .............. | 438/305 |
| 6,083,816 A | * | 7/2000 | Kanamori ............. | 438/585 |
| 6,479,362 B2 | * | 11/2002 | Cunningham .......... | 438/369 |

* cited by examiner

*Primary Examiner*—John Niebling
*Assistant Examiner*—Ron Pompey
(74) *Attorney, Agent, or Firm*—Foley & Lardner

(57) ABSTRACT

A method for manufacturing a DRAM includes the steps of forming a gate oxide film, a polysilicon film and a tungsten silicide film consecutively on a silicon substrate, selective etching the tungsten silicide film, covering exposed side surfaces of the tungsten silicide film by a polysilicon side-wall film, selectively etching the polysilicon film, oxidizing the polysilicon side-wall film and exposed surfaces of the polysilicon film, and forming a gate electrode including the polysilicon film and the tungsten silicide film. The resultant DRAM has lower leakage current and excellent refresh characteristics due to less contamination of diffused regions by the tungsten particles.

7 Claims, 3 Drawing Sheets

METHOD FOR MANUFACTURING A SEMICONDUCTOR DEVICE HAVING A LAYERED GATE ELECTRODE

BACKGROUND OF THE INVENTION (a) Field of the Invention

The present invention relates to a method for manufacturing a semiconductor device having a layered gate electrode and, more particularly, to a method for forming an improved structure of the layered gate electrode including a polysilicon film and a metal silicide film.

(b) Description of the Related Art

MOSFETs are most important elements in a current semiconductor device having a finer and finer structure. In such a current semiconductor device, the gate electrode of the MOSFET generally has a layered structure including a polysilicon film and a metal silicide film.

FIGS. 3A to 3D are sectional views of a conventional MOSFET having a layered gate structure during consecutive steps of fabrication thereof. The MOSFET is used, for example, in a semiconductor memory device (DRAM). First, an element isolation structure and diffused regions are formed on a p-type semiconductor substrate 11 by known techniques, followed by consecutive deposition of a 7-nm-thick gate oxide film 12, a 10 nm-thick polysilicon film 13, a 120-nm-thick tungsten silicide film 14, and a 200-nm-thick silicon nitride film. Thereafter, a photoresist film is formed thereon, and patterned using a photolithographic process to form a photoresist pattern 15.

The silicon nitride film is then patterned by an anisotropic etching technique using the photoresist pattern 15 as an etching mask, thereby forming a nitride hard mask 16 to obtain the structure shown in FIG. 3A. Subsequently, the photoresist pattern 15 is removed, followed by etching the tungsten silicide film 14 and the polysilicon film 13 by using the nitride hard mask 16 as an etching mask to thereby obtain a gate electrode pattern, as shown in FIG. 3B.

Thereafter, a heat treatment is conducted at a temperature of 1000 degrees C. for 60 seconds to oxidize the side surfaces of the gate electrode pattern, thereby forming 5-nm-thick side-wall oxide films 19 thereon, as shown in FIG. 3C. The side-wall oxide film 19 alleviates the electric field at the edge of the gate electrode. Subsequently, impurity ions are implanted by using a known ion-implantation technique to form n-type diffused regions 20 on the semiconductor substrate 11. Further, a side-wall cover film 21 is formed on the gate electrode pattern by deposition and etching techniques, followed by deposition of an interlevel dielectric film 22 to embed the gate electrodes and the gap therebetween, as shown in FIG. 3D. Thereafter, other constituent elements including contact plugs and interconnects are formed by known techniques to obtain the final structure of the DRAM.

It is to be noted in the above structure of the DRAM that the side surfaces of the tungsten silicide film 14 are exposed during etching of the polysilicon film 13 as shown in FIG. 3B. Thus, the exposed surfaces of the tungsten silicide film 14 are also etched to form particles 23, which contaminate the substrate surface in the diffused regions 20 formed in the subsequent step. The contamination of the diffused regions 20 causes a problem of increase of the leakage current in the resultant MOSFET.

In addition, there arises another problem of an offset in the side-wall oxide film 19 formed on the sides of the gate electrode structure, as shown in FIG. 3C, due to the fact that the tungsten silicide film 14 is oxidized at a higher rate compared to the polysilicon film 13. The offset causes a specified location 24 to have less amount of dosage after the ion-implantation, whereby the MOSFETs have degraded transistor characteristics and may suffer from a lower product yield of non-defective MOSFETs. For avoiding the problem of offset in the side-wall oxide film, it may be considered that the amount of oxidation for the side surfaces of the gate electrode is set lower; however, this results in a degradation of refresh characteristic in the DRAM.

Moreover, the offset in the side-wall oxide film 19 raises a problem on the overall structure of the gate electrode, which may cause a void 25 in the embedding interlayer dielectric film 22. This also reduces the product yield of non-defective MOSFETs.

SUMMARY OF THE INVENTION

In view of the above, it is an object of the present invention to provide a method for manufacturing a semiconductor device, which is capable of protecting the substrate surface against the contamination by metal silicide particles and suppressing the offset of the side surfaces of the gate electrode to improve the refresh characteristic of the semiconductor device implemented as a DRAM.

The present invention provides a method for manufacturing a semiconductor device including the consecutive steps of: forming a gate oxide film, a first silicon film and a metal silicide film consecutively on a semiconductor substrate; selectively etching the metal silicide film; covering at least side surfaces of the metal silicide film by a second silicon film; selectively etching the first silicon film; and forming a gate electrode structure including the first and second silicon films and the metal silicide film.

In accordance with the method of the present invention, the second silicon film covering the side surfaces of the metal silicide film prevents metal silicide particles from dropping and scattering onto diffused regions of the semiconductor substrate during etching the first silicon film, whereby transistor characteristics of the resultant semiconductor device can be improved.

The first and second silicon films and the metal silicide film may be replaced by first through third conductive films, respectively, the first and third conductive films being made of a first conductive material, the second conductive film being made of a second conductive material.

The above and other objects, features and advantages of the present invention will be more apparent from the following description, referring to the accompanying drawings.

PREFERRED EMBODIMENTS OF THE INVENTION

Figure 1A:
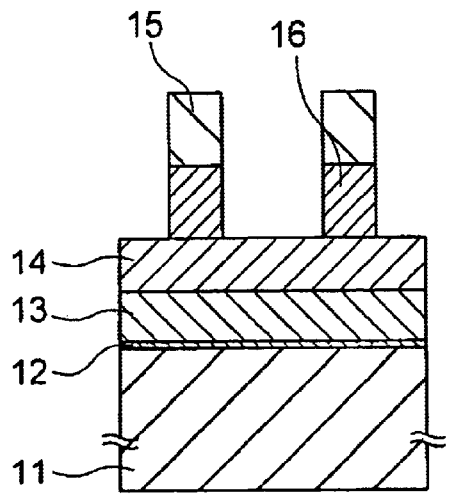
FIGS. 1A to 1E are sectional views of a semiconductor device during consecutive steps of a fabrication process thereof according to an embodiment of the present invention.

Now, the present invention is more specifically described with reference to accompanying drawings, wherein similar constituent elements are designated by similar reference numerals.

Referring to FIGS. 1A to 1E, there is shown a fabrication process of a DRAM, i.e., a semiconductor device according to an embodiment of the present invention. An element isolation structure and diffused regions are formed on a semiconductor (silicon) substrate 11, followed by consecutive deposition of a 7 nm-thick gate oxide film 12, a 100-nm-thick polysilicon film 13, a 120-nm-thick tungsten silicide film 14, and a 200-nm-thick silicon nitride film (not shown). Subsequently, a photoresist pattern 15 is formed thereon using a photolithographic technique, followed by patterning the silicon nitride film by an anisotropic etching technique using the photoresist pattern 15 as an etching mask, thereby forming a nitride hard mask 16 to obtain the structure shown in FIG. 1A.

Figure 1B:
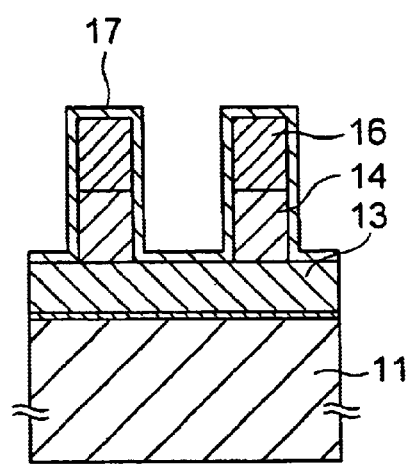
Figure 1C:
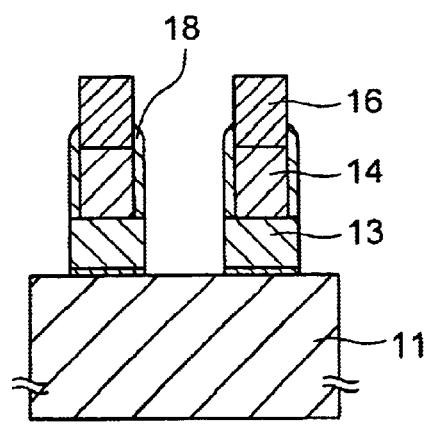

Thereafter, the photoresist mask 15 is removed, followed by etching the tungsten silicide film 14 by using the nitride hard mask 16 as an etching mask and depositing thereon a 10-nm-thick polysilicon film 17, as shown in FIG. 1B. The polysilicon film 17 effectively protects the side surfaces of the tungsten silicide film 14 during the subsequent step. The polysilicon film 17 thus deposited and the underlying polysilicon film 13 are then subjected to an anisotropic selective etching process to form a gate electrode pattern. After this etching process, the etched polysilicon film 13 has a width somewhat larger than the width of the tungsten silicide film 14 so that part of the polysilicon film 17 covering the side surfaces of the tungsten silicide film 14 is left as a 5-nm-thick side-wall polysilicon film 18, as shown in FIG. 1C.

Figure 1D:
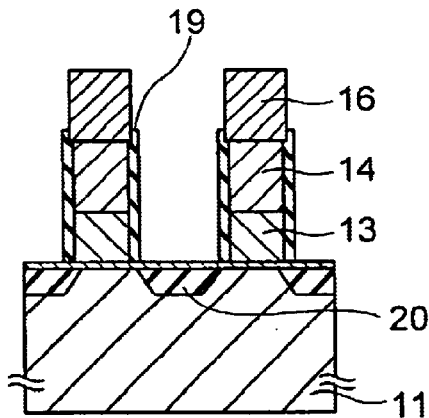
Figure 1E:
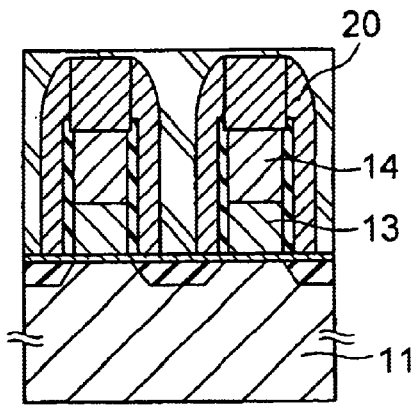

Subsequently, a heat treatment is conducted at a temperature of 1100 degrees C. for 60 seconds to oxidize the exposed surfaces of the polysilicon film 13 and the side-wall polysilicon film 18 to form a 9-nm-thick oxide film 19 on the side surfaces of the gate electrode structure, as shown in FIG. 1D. The resultant oxide film 19 has a function for alleviating the electric field at the edge of the gate electrode. Thereafter, n-type impurities are introduced into the p-type semiconductor substrate 11 to form n-diffused regions 20 therein by using a known ion-implantation technique. Further, an interlevel dielectric film 22 is deposited to embed the gap between the gate electrodes as well as the top thereof, as shown in FIG. 1E. Other constituent elements such as contact plugs, interconnect layers and dielectric films are then formed by using known techniques to obtain the final structure of DRAM.

Figure 2:
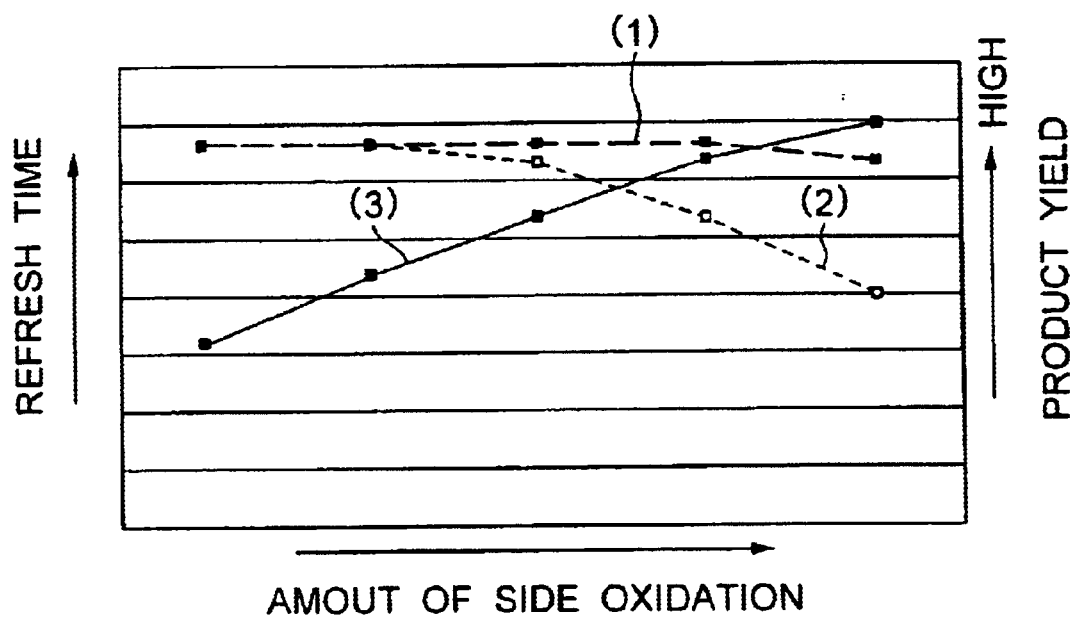
FIG. 2 is a graph showing product yields of the non-defective MOSFETs and the refresh time of a resultant DRAM, which are plotted against the amount of side oxidation for the gate electrode.
Figure 3A:
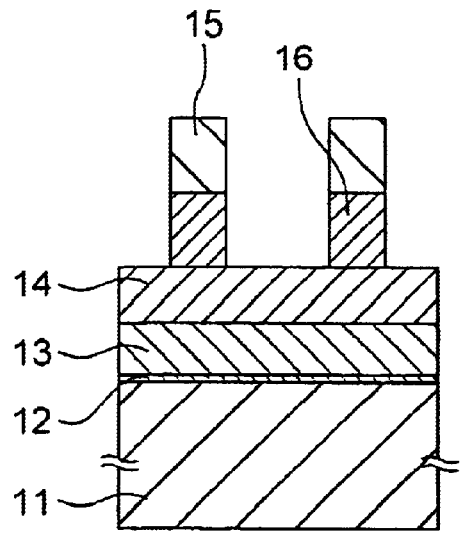
FIGS. 3A to 3D are sectional views of a semiconductor device during consecutive steps of a conventional fabrication process thereof.
Figure 3B:
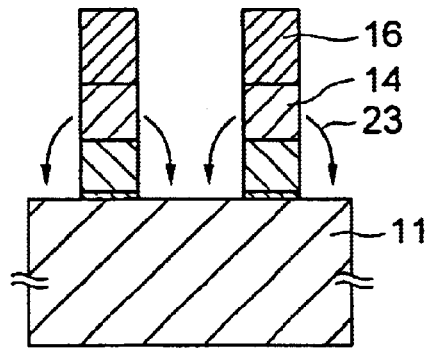
Figure 3C:
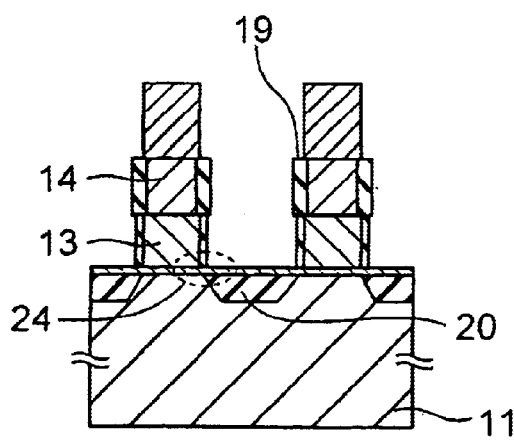
Figure 3D:
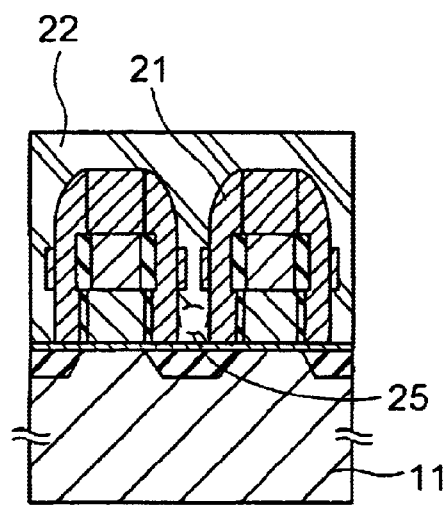

FIG. 2 shows the product yields of non-defective DRAMs manufactured by the methods of the above embodiment and the conventional technique by using dotted lines, the product yields being plotted on the ordinate against the amount of side oxidation obtained by the above heat treatment and plotted on the abscissa. FIG. 2 also shows a typical relationship between the refresh time and the amount of oxidation in a DRAM by using a solid line.

As understood from FIG. 2, the refresh time of the DRAM is prolonged to improve the refresh characteristic thereof by increasing the amount of the side oxidation, i.e., by conducting a strong oxidation on the side surfaces of the gate electrode. However, the DRAM manufactured by the conventional technique has a degraded product yield in this case due to the larger amount of side oxidation, which may cause generation of voids. This limits the amount of side oxidation in the conventional technique. On the other hand, the product yield is not reduced in the DRAM manufactured by the above embodiment even in the case of a higher amount of side oxidation. This allows a higher side oxidation to be conducted in the method of the present embodiment.

In the above embodiment, during the etching of the underlying gate polysilicon film 13, which is conducted with the side surfaces of the tungsten silicide film 14 being protected by the polysilicon film 17, the tungsten silicide particles are prevented from being dropped and scattered from the tungsten silicide film 14 onto the semiconductor substrate 11 in the diffused regions 20. This suppresses the increase of leakage current in the resultant DRAM.

The protection of the side surfaces of the tungsten silicide film 14 by the side-wall polysilicon film 17 also suppresses oxidation of the tungsten silicide film 14, thereby suppressing degradation of the contour of the gate electrode pattern and thus preventing degradation of the transistor characteristics in the resultant DRAM.

Since the above embodiments are described only for examples, the present invention is not limited to the above embodiments and various modifications or alterations can be easily made therefrom by those skilled in the art without departing from the scope of the present invention. For example, the polysilicon films may be replaced by other conductive films such as amorphous silicon films, and the tungsten silicide film may be replaced by another metal silicide film such as a titanium silicide film.

What is claimed is:

1. A method for manufacturing a semiconductor device comprising the consecutive steps of:

forming a gate oxide film, a first silicon film and a metal silicide film consecutively on a semiconductor substrate;

selectively etching the metal silicide film;

covering at least side surfaces of the metal silicide film by a second silicon film;

selectively etching the first silicon film; and forming a gate electrode structure including the first and second silicon films and the metal silicide film;

further comprising the step of oxidizing the second silicon film and exposed surfaces of the first silicon film between the step of selectively etching the first silicon film and the step of forming the gate electrode structure.

2. The method according to claim 1, wherein the first and second silicon films are polysilicon films.

3. The method according to claim 1, wherein the first and second silicon films are amorphous silicon films.

4. The method according to claim 1, wherein the metal silicide film is either a tungsten silicide film or a titanium silicide film.

5. The method according to claim 1, wherein the first silicon film has a width larger than a width of the metal silicide film after the step of selectively etching the first silicon film.

6. A method for manufacturing a semiconductor device comprising the consecutive steps of:

forming a gate oxide film, a first conductive film made of a first conductive material, and a second conductive film made of a second conductive material, consecutively on a semiconductor substrate;

selectively etching the second conductive film;

covering side surfaces of the second conductive film by a third conductive film made of the first conductive material;

selectively etching the first conductive film; and forming a gate electrode structure including the first through third conductive films and further comprising the step of oxidizing the third conductive film and exposed surfaces of the first conductive film between the step of selectively etching the first conductive film and the step of forming the gate electrode structure.

7. The method according to claim 6, further comprising the step of oxidizing the third conductive film and exposed surfaces of the first conductive film between the step of selectively etching the first conductive film and the step of forming the gate electrode structure.

* * * * *